United States Patent
Wu et al.

(10) Patent No.: US 8,723,300 B2
(45) Date of Patent: May 13, 2014

(54) MULTI-CHIP MODULE POWER CLIP

(75) Inventors: Chung-Lin Wu, San Jose, CA (US);
Steven Sapp, Santa Cruz, CA (US);
Bigildis Dosdos, San Jose, CA (US);
Suresh Belani, Los Altos, CA (US);
Sunggeun Yoon, Cupertino, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/584,015

(22) Filed: Aug. 13, 2012

(65) Prior Publication Data

US 2014/0042599 A1 Feb. 13, 2014

(51) Int. Cl.
*H01L 23/495* (2006.01)
*H01L 21/00* (2006.01)

(52) U.S. Cl.
USPC .......... 257/676; 257/723; 257/E23.031; 257/E23.044; 438/106; 438/107; 438/123

(58) Field of Classification Search
USPC .......... 257/672, 673, 675, 676, 678, 257/E23.001–E23.194; 438/106, 107, 123
See application file for complete search history.

(56) References Cited

U.S. PATENT DOCUMENTS

| | | | |
|---|---|---|---|
| 7,301,235 B2 | 11/2007 | Schaffer et al. | |
| 7,781,872 B2 * | 8/2010 | Grey | 257/666 |
| 7,868,432 B2 | 1/2011 | Lee et al. | |
| 7,898,092 B2 | 3/2011 | Lu et al. | |
| 8,018,054 B2 * | 9/2011 | Liu et al. | 257/724 |

OTHER PUBLICATIONS

National Semiconductor Corporation, DS012931 (www.national.com) Texas Instruments, "LM3641 Lithium-Ion Battery Pack Protection Circuit" Jan. 1999, pp. 1-13, 14, 15.

* cited by examiner

*Primary Examiner* — Jasmine Clark
(74) *Attorney, Agent, or Firm* — Christensen O'Connor Johnson Kindness PLLC

(57) ABSTRACT

The multi-chip leadless module 200 has integrated circuit (IC) 150, dual n-channel mosfet 110, IC leads 210, 211, 212, gate leads 213, 213, and source leads 217-220 encapsulated in resin 250. The IC 150 and the dual n-channel mosfet 110 are mounted face down on the leads. IC leads 210, 211, 212 are made of planar metal and connect, respectively, to the electrodes TEST, VDD and VM on the IC 150 using a flip chip technique to assemble the leads on copper pillars or copper studs.

21 Claims, 6 Drawing Sheets

MULTI-CHIP MODULE POWER CLIP

BACKGROUND

Various protection mechanisms for lithium ion batteries exist. If a lithium ion battery overcharges, strong exothermic reactions are possible and the potential for causing a fire increases. To prevent a lithium ion battery from overcharging, a battery protection circuit is used. The battery protection circuit, an example of which is shown in FIG. 1, often contains, among other components, a dual channel mosfet 21 with two FET (field effect transistor) switches 22, 24 and a control IC (integrated circuit) 20. One FET prevents current from flowing into the battery, while the other prevents current from flowing from the battery unless the control IC enables it.

Multi-chip modules containing control ICs and MOSFETs exist. However, a number of improvements could be made. For example, some conventional multi-chip modules contain leads on all four sides of the packages. This results in larger modules, which is undesirable, because such modules are used in small electronic devices such as cell phones. The sizes of the multi-chip modules can be reduced, but this reduces the current carrying capacity of the chips that can be used in such packages.

See, for example, U.S. Pat. No. 7,868,432 which is assigned to the same assignee as this patent and is hereby incorporated by reference. It discloses features that lead to a compact, multi-chip module. First, the die mounting pad of the leadframe structure for the power MOSFETs can extend completely from one edge of the multi-chip module to the other. This allows a large size of a power chip on the die mounting pad thereby increasing the current rating of the power MOSFETs. Second, there are no "down bonds" from either the power chip or the IC chip to the leadframe structure. Third, connections between the IC and the power MOSFETs are made by chip-to-chip interconnects (e.g., wire interconnects). Fourth, the number of external leads and signal routing elements adjacent to the MOSFET die mounting pads are reduced. By reducing the external leads and eliminating "down bonds", the area inside the package is increased to allow for larger power MOSFETs. The increased size of the power MOSFETs reduces on-resistance which reduces power loss and reduces heating. This ultimately increases the useful energy of the battery.

SUMMARY

However, even the numerous advantages of the above exemplary device can be improved. The '432 device has a number of wire bonds which produce parasitic inductance, resistance and capacitance and adversely impact performance. Other bonding techniques could reduce source electrical resistance. The integrated circuit could be better protected during assembly to improve batch yield. It is desired to have a still smaller and improved overall package.

A multi-chip leadless module has two n-channel mosfets on a single die and share a common drain. The module also includes a control integrated circuit. The devices are assembled using flip chip technology for the mosfets and raised contact surfaces such as solder bumps, copper studs or copper pillars for the integrated circuit to connect the mosfets and integrated circuit to the leadframe without wire bonding. The devices are disposed face down on leads that interconnect the devices and extend outside the encapsulating resin.

The devices in the module are assembled on a leadframe that has a plurality of leads. Each lead has an external, exposed contact surface on an outer bottom surface of the module. The leads carry electrical power to the integrated circuit and to the dual channel mosfet and also carry electrical signals to and from the integrated circuit and the dual channel mosfet. The module is manufactured by encapsulating the leadframe, the integrated circuit and the dual channel mosfet in an insulating resin to form the module and define exposed contact surfaces of the leads on the outer bottom surface of the module. The leads on the leadframe are configured to reduce the footprint of the module, lower its resistance and reduce parasitic capacitance and inductance. To this purpose, a first lead is connected to a first electrode of the integrated circuit and to the gate of one dual channel mosfet, a second lead is connected to a second electrode of the integrated circuit and to the gate of the other dual channel mosfet, a third lead is connected to a third electrode of the integrated circuit and to the source of one of the dual channel mosfets, a fourth lead is connected to a fourth electrode of the integrated circuit and to the source of the other dual channel mosfet.

The dual channel mosfet has two mosfet dies that are made on a common wafer. The two dies are separated from the wafer but not from each other. As such, each mosfet has its own source and gate electrodes and shares a common drain electrode. The control integrated circuit has one or more electrodes for connecting to the dual channel mosfet and to external system nodes such as VDD, VM and TEST. Electrodes on the control integrated circuit connect it to the gates and sources of the mosfets. The integrated circuit includes circuits for turning the mosfets on and off.

The control integrated circuit and the dual channel mosfet are mounted face down on the leads of the leadframe which is then molded in an encapsulating and insulating resin. As such, no bond wires are used. During assembly an array of leadframes are provided. The array is stamped from a sheet of metal that includes opposing rails and tie bars to hold the leadframes during assembly and molding. The IC and mosfet are soldered on the leads and held in place. Arrays of leadframes are placed in cavities of a mold and the mold is placed in a transfer molding machine. The machine transfers molten encapsulating and insulating resin into the mold where the resin is allowed to cool and cure. Thereafter, the mold is open and the molded devices are detached from their leadframes by one or more finishing machines. The encapsulating and insulating resin defines an outer bottom surface where external contact surfaces of the leads are exposed for connection to other devices or system components.

The preferred embodiments of the invention have an advantage of reduced size of the multi-chip module compared to wire bonded modules. This is made possible by the non-singulated dual channel mosfet. The physical distance between two adjacent mosfets on the die is very small but is large enough to effectively separate the electrical operation of the mosfets from each other. The common drain provided by the non-singulated mosfet eliminates process steps and materials for connecting the drains of the mosfets. By flip chip mounting the IC and dual channel mosfet, the preferred embodiments eliminate bond wires and reduce parasitic inductance and capacitance. Lower inductance and capacitance allows the module to operate at more efficient higher frequencies. The multi-chip module has fewer external contacts and takes up less space than modules which use bond wires and mount devices facing up. This gives the preferred embodiments an advantage of smaller footprints compared to conventional wire bonded modules. The preferred embodiments also have an advantage of lower operating (RSS) resistance due to the non-singulated mosfets and no wires. The preferred embodiments improve electrical and thermal performance by attaching a single drain clip or heat sink to the common drain.

DETAILED DESCRIPTION

The integration of a power semiconductor switch and a control IC for regulating the charging of a battery such as a cell phone battery is disclosed. In embodiments of the invention, a small form factor multi-chip module is disclosed and it can be mounted onto a miniature circuit board. The miniature circuit board can be connected to a terminal end of a battery pack. The multi-chip module may form part of a battery protection circuit.

Figure 1A:
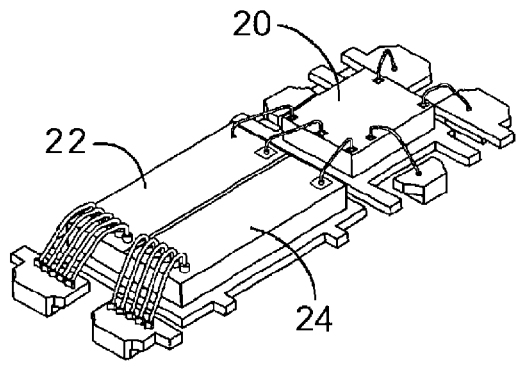
FIG. 1A is an electrical schematic of the multi-chip module shown in U.S. Pat. No. 7,868,432.
Figure 1B:
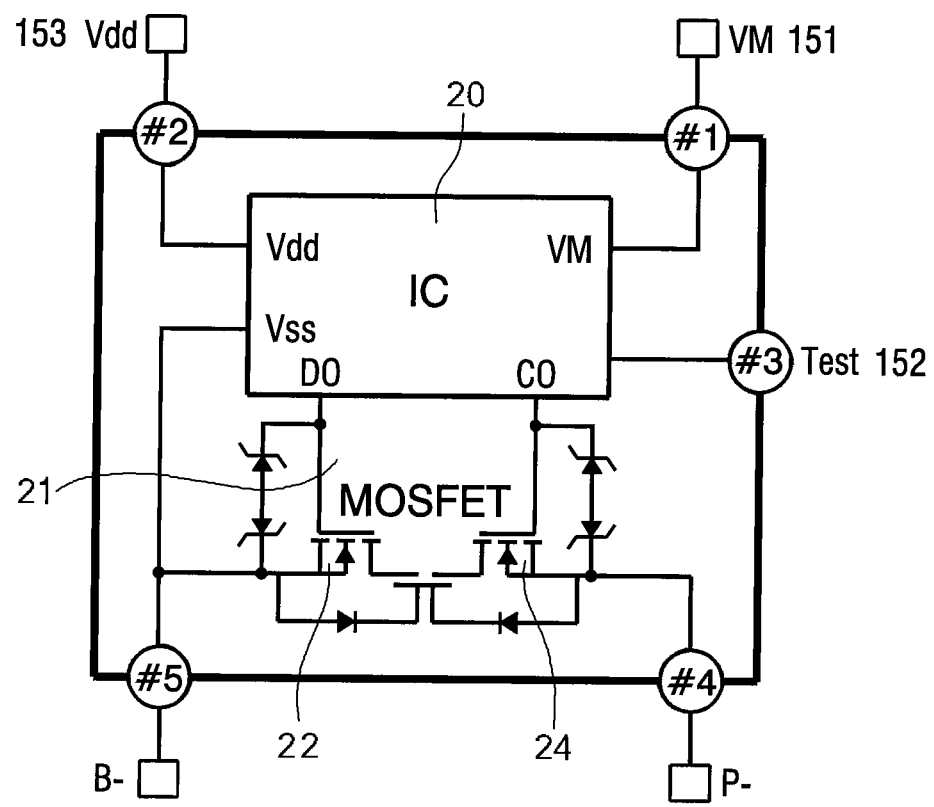
FIG. 1B is an electrical schematic of the multi-chip module of FIG. 1A.

FIG. 1A shows a conventional battery protection circuit. Some have used discrete components to create the circuit shown in FIG. 1A. When many discrete components are used to form the circuit shown in FIG. 1A, the protection circuit may end up occupying a relatively large amount of space. For example, a minimum of eight solder pads may be required on the circuit board just for the discrete IC and power MOSFETs. See, for example, U.S. Pat. No. 7,868,432, incorporated herein by reference. FIG. 1B is an electrical schematic of the battery protection circuit of FIG. 1A.

Figure 2A:
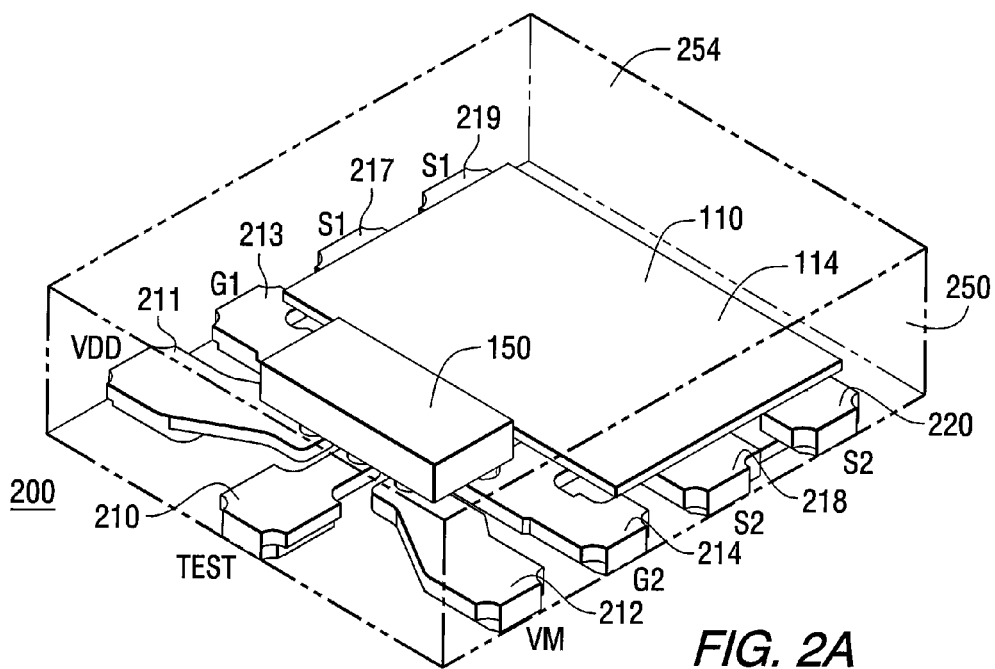
FIG. 2A is a perspective view of the multi-chip module showing the encapsulating and insulating resin in outline.
Figure 2B:
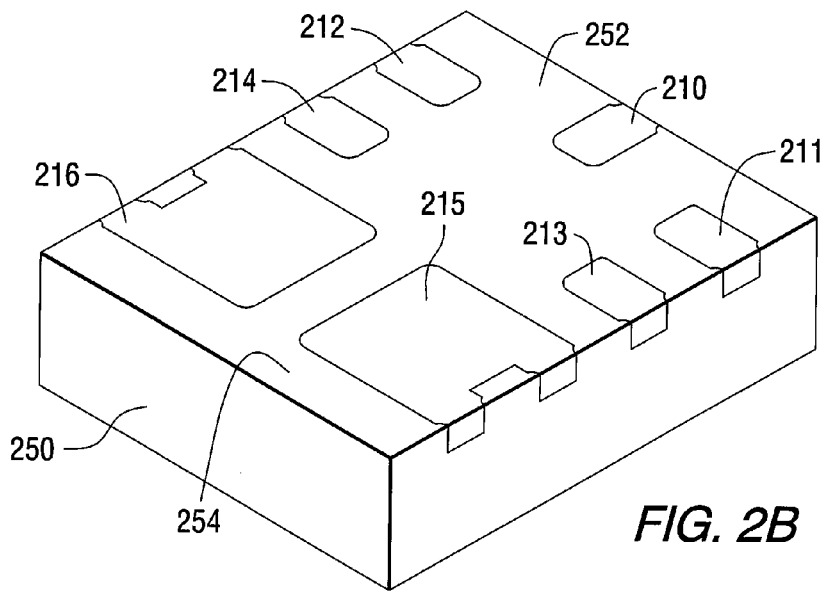
FIG. 2B is a perspective view of the multi-chip module.
Figure 5:
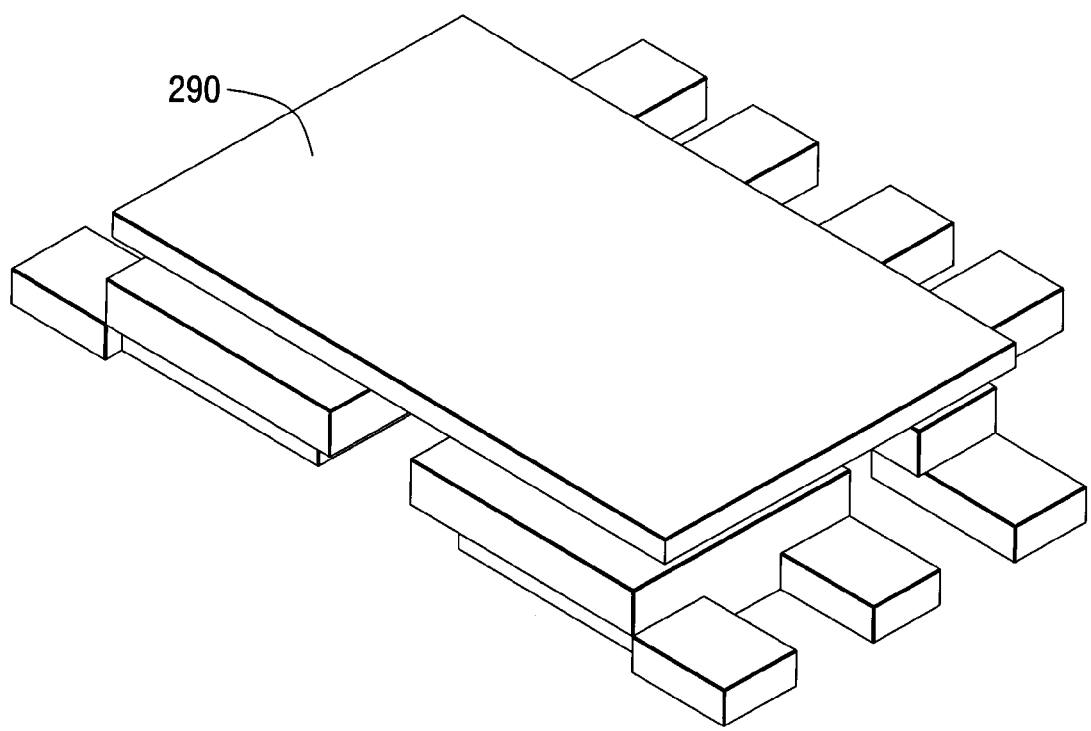
FIG. 5 shows a clip attached to the two drains of the dual channel mosfet.

Turning to FIGS. 2A, 2B, the multi-chip leadless module 200 shows its components including integrated circuit (IC) 150, dual n-channel mosfet 110, IC leads 210, 211, 212, gate leads 213, 213, and source leads 217-220 encapsulated in resin 250. The IC 150 and the dual n-channel mosfet 110 are mounted face down on the leads. IC leads 210, 211, 212 are made of planar metal and connect, respectively, to the electrodes TEST, VDD and VM on the IC 150. As such, the IC 150 is flip chip attached to its leads 210, 211 and 212. Electrical and mechanical connection is made using one or more conventional methods including and not limited to copper pillars or copper studs that extend from the IC 150 to the leads or pads. Source leads 217, 219 are part of source pad 215; source leads 218, 220 are part of source pad 216. The source pads are attached to the respective sources of the dual n-channel mosfet 110. The sources and gates face down and the common drain 114 faces up. An optional drain clip or heat sink 280 may be attached to the common drain. See FIG. 5. Such a drain clip or heat sink would extend to and be exposed on the top upper surface 254 of the encapsulating resin 250. The common drain clip not only dissipates heat but also reduces resistance between the two drains to thereby prevent generation of unwanted heat due to electrical resistance between the drains. When the clip is exposed, the device is dual cooled by the source pads 215, 216 of the lead frame and the drain clip 280. The clip may be made of metal or metal alloy or any other material capable of effectively transferring heat from the dual channel mosfet.

As shown in FIG. 2B, the leads and source pads 210-220 have external contact surface that are exposed on the bottom surface 252 of the encapsulating resin 250. The 215 and 216 pads are half etched from top of leadframe. The full Cu leadframe defines the source contact area and it is matched with opening of source contact at the die. The benefit of half etching on top of leadframe allows direct flip chip die on leadframe without using bumped wafer (solder, or pillar bump). In the mean time it is easy to control and maintain certain solder bond line thickness.

Figure 3:
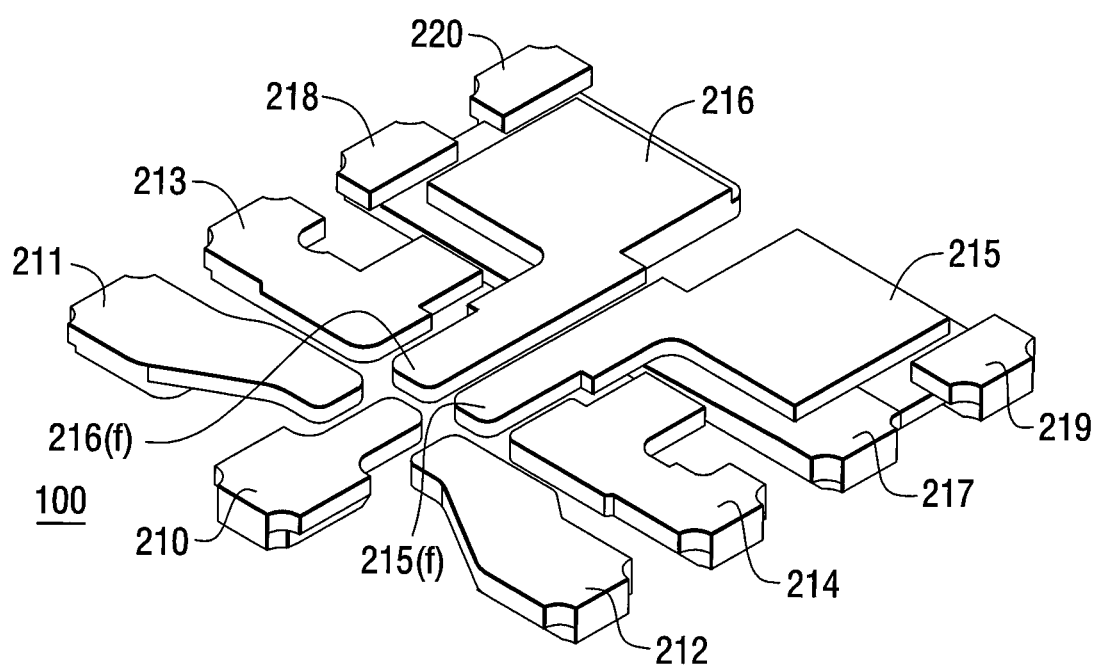
FIG. 3 is a perspective view of an individual leadframe.
Figure 4:
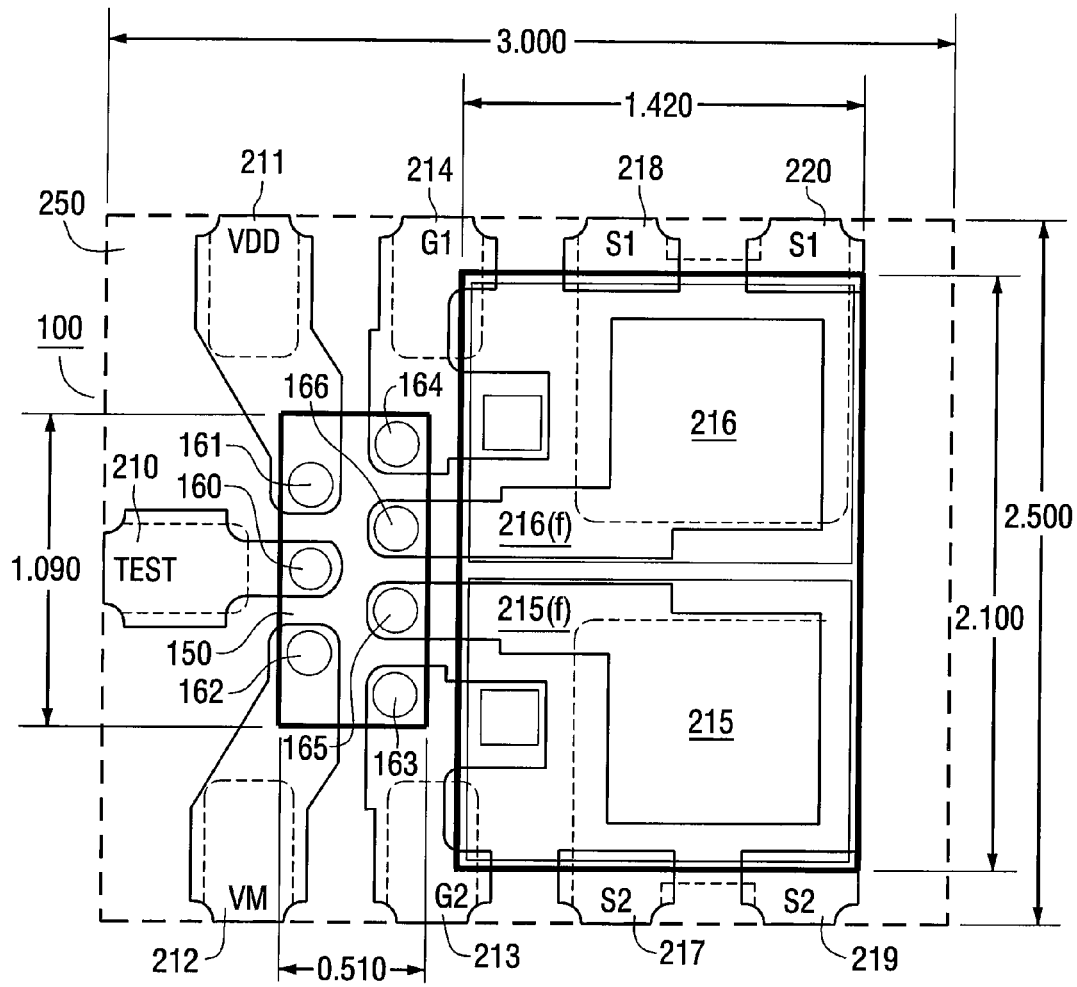
FIG. 4 is an enlarged plan view showing the IC and the mosfet assembled on the leadframe.

Turing to FIG. 3, the leadframe 100 shows its leads 210-220. In particular, leads 218 and 220 are integral with one source pad 216 that has a lead finger, 216(f). Likewise, leads 217 and 219 are integral with another source pad 215 which has a lead finger 215(f). Turning to FIG. 4, outlines of the IC 150 and the dual channel mosfet 110 are superimposed over the leads. The dashed lines in the leads indicate top surfaces of the leads are half etched to provide shallow cavities that receive the encapsulating resin 250 to lock the leads into the resin. The leads are arranged in an array with one end of each lead disposed near the periphery of the resin and the other end disposed deeper in the resin and connected to one or more electrodes of one of the component devices 110, 150.

The IC 150 has seven electrodes. It is flip chip mounted face down so that is copper pillars or copper studs 160-166 attach to corresponding leads 210-216. The flip chip mounting using copper pillars/studs 160-166 protect the IC 150 during assembly. For conventional wire bonded connections, the IC would have to be die attached to a die pad and then wire bonded from its top contacts to the peripheral leads of a leadframe with a die pad. The conventional die attach process concentrates the impact of the attachment forces on the center of the die which may break it. In contrast, the flip chip mounted IC has seven pillars/studs 160-166 that attach the IC 150 to leads 210-215. These multiple points of contact spread the impact of the die across the seven pillars or studs and does not concentrate the impact force on the center of the IC 150.

Lead 210 receives pillar/stud 160 that connects to the IC TEST electrode. Lead 210 extends from the TEST electrode to the periphery of the resin 250. Lead 211 receives pillar/stud 161 that connects to the VDD electrode of IC 150. Lead 211 extends to the top edge of the resin 250. Lead 212 receives pillar/stud 162 that connects to the VM electrode. Lead 212 extends to the bottom edge of the resin 250. Lead 213 receives pillar/stud 163 that connects to a gate control electrode on the IC and to the gate electrode of one MOSFET. Lead 213 extends from the IC 150 to the bottom edge of the resin. Another lead 214 receives pillar/stud 164 that connects to the gate of the other MOSFET and another gate control electrode of the IC. Lead 214 extends in the opposite direction compared to lead 213 and terminates at the opposite (top) edge of the resin 250. The source pad 215 has a finger 215(f) pointing toward an electrode on the IC. A pillar/stud 165 of the IC extends to the finger 215(f) of the lead 215. The source pad 215 has two external leads 217, 219 that extend from the source pad in a direction transverse to the finger 215(f) and terminate on one edge of the package. As a result, the external source leads 217, 219 are connected to one of the electrodes of the IC below the pillar/stud 165 via the source pad 215 and the source finger 215(f). Source pad 216 has a corresponding finger 216(f) pointing toward another electrode of IC 150. A pillar/stud 116 extends from the IC 150 and attaches to finger 216(*f*). Leads 218, 220 extend to the edge of the package opposite the termination of leads 217, 219. As a result, the external source leads 218, 220 are connected to another one of the electrodes of the IC below the pillar/stud 166 via the source pad 216 and the source finger 216(*f*). It will be appreciated that the source of one mosfet is connected to two external pins on one side of the package and to an internal electrode of the IC 150 and the source of the other mosfet is connected to two other external pins on the other side package and to another internal electrode of the IC 150. In a similar manner two other leads with external pins on opposite sides of the package connect the gates of the mosfets to internal IC electrodes.

Those skilled in the art are familiar with a variety of methods for applying conductive bumps and pillars to semiconductors and integrated circuits. See, for example, U.S. Pat. No. 7,208,834 which is representative of known methods for forming copper pillars and is hereby incorporated by reference. See also, for example, U.S. Pat. Nos. 8,058,735 and 6,617,655, hereby incorporated by reference, which are representative of known methods for forming metal bumps, including copper bumps.

Those skilled in the art understand that the dual channel mosfet is a cellular structure that contains numerous cells comprising highly doped source regions separated by gate regions. The highly doped source region is over a more lightly doped drift region. The bottom surface is a highly doped drain region with a metal layer. For simplicity of explanation, let us assume the device is a trench gated dual mosfet. The current path is vertical along channels established adjacent the trenches and through the drift region. The doping of the drift region determines the on resistance and the breakdown voltage of the device.

Figure 6A:
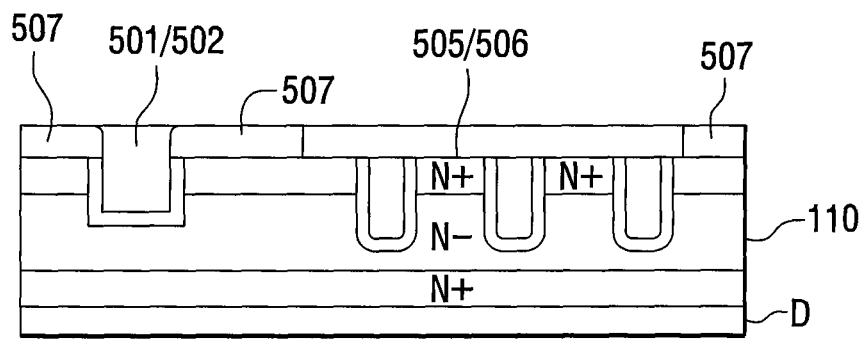
FIG. 6A is a sectional view of the dual channel mosfet taken through one of the gate and source contact regions.
Figure 6B:
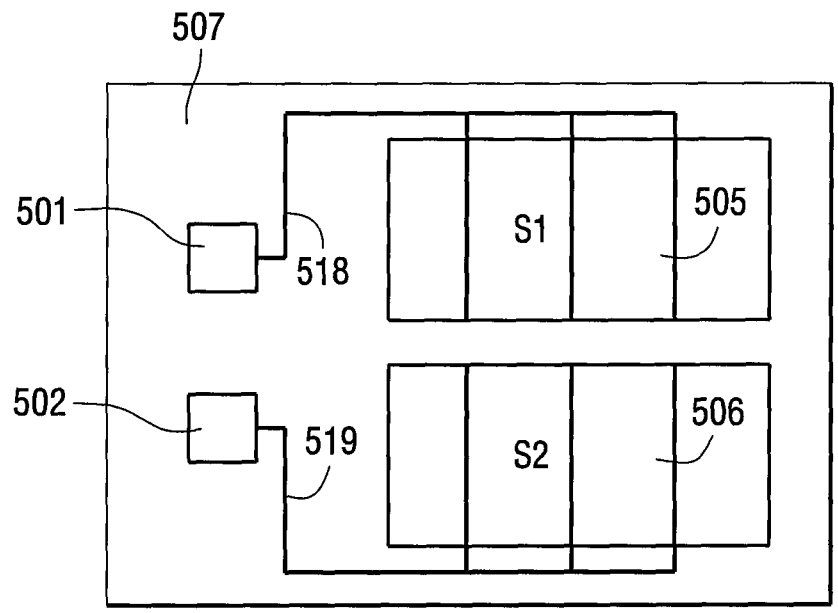
FIG. 6B is a plan view of the dual channel mosfet showing the passivation layer surrounding the gate and source contact regions.

Turning to FIGS. 6A and 6B, in each mosfet, the gate regions are electrically connected together to form a unitary gate electrode structure for carrying the gate signal. The gate electrodes are electrically isolated from the source regions during fabrication. For example, in a typical gate trench process, the gates are buried in trenches in a highly doped source region. The sidewalls and the tops of the trench are insulated.

The top insulation on the gate trenches allows the creation of a relatively large source contact region which isolated from the trench gate electrodes. One end of each trench is connected to buried, insulated header trench 518, 519 having highly doped polysilicon. The header trenches terminate at relatively large gate contact areas 501, 502, respectively. The source electrode includes a metal layer, such as an aluminum layer, that covers the tops of the source regions.

Near the end of the process, the top of the dual mosfet 110 is covered with a passivation layer 507. The passivation layer is patterned with photoresist to define the contact areas 501, 502 for the gate electrode contact area source electrode contact areas 505, 506. The passivation layer 507 above the contact areas 501, 502, 505, 507 is removed and an under bump metal such as electroless nickel gold (ENIG), or Ti/Ni/Ag, is deposited on the contact areas for soldering to the source pads and the gate leads. The passivation is made of glass, BPSG, silicon nitride, or polymeric material including and not limited to polyimide.

In order to assemble the package, the mosfet 110 and the IC 150 are manufactured to have input and output electrodes with copper pillars or copper bumps. In a preferred embodiment, the IC 150 has solder bumps or Cu studs/pillars and the MOSFET is directly flip chip mounted on pads 215, 216. The leadless leadframe 100 is shown in FIG. 4. The IC 150 and the mosfet 110 are both mounted face down on the leads and pads of the lead frame. The tops of the pillars and bumps may have solder layers. An electrical adhesive may be applied to the leads and pads and/or the pillars and bumps to hold the devices on the leads. The solder layer is reflowed to thereby permanently attach the pillars and bumps to the leads and pads of the leadframe. Those skilled in the art understand that the multiple leadframes are normally manufactured in arrays disposed between opposing elongated rails. The leadframe is supported between the rails by tie bars. After the devices are assembled and permanently attached to the leadframes, the array is placed in a transfer mold which in turn is placed in a transfer molding machine. That machine transfers molten insulating resin to the mold to encapsulate the devices in the insulating resin. The mold is allowed to cool and cure and the encapsulated devices in the lead frame array are separated from their respective tie bars and rails.

The invention claimed is:

1. A multi-chip leadless module comprising:
an integrated circuit having a plurality of electrodes;
a dual channel mosfet having first and second source electrodes, first and second gate electrodes and a common drain electrode;
a leadframe having a plurality of leads, each lead with an exposed contact surface on an outer bottom surface of the module for carrying electrical power to the integrated circuit and to the dual channel mosfet or for carrying electrical signals to and from the integrated circuit and the dual channel mosfet;
an encapsulating and insulating resin embedding the leadframe, the integrated circuit and the dual channel mosfet into a module and defining the exposed contact surfaces of the leads on the outer bottom surface of the module;
wherein a first lead is connected to a first electrode of the integrated circuit and to the gate of one dual channel mosfet, a second lead is connected to a second electrode of the integrated circuit and to the gate of the other dual channel mosfet, a third lead is connected to a third electrode of the integrated circuit and to the source of one of the dual channel mosfets, a fourth lead is connected to a fourth electrode of the integrated circuit and to the source of the other dual channel mosfet.

2. The multi-chip leadless module of claim 1 wherein one or more other leads are connected respectively to corresponding one or more other electrodes of the integrated circuit.

3. The multi-chip leadless module of claim 1 wherein the leadframe has one or more half-etched pads, each pad for receiving flip chip mounted mosfets.

4. The multi-chip leadless module of claim 1 wherein the integrated circuit comprises one or more raised surfaces for attaching to leads of the leadframe.

5. The multi-chip leadless module of claim 4 wherein the leadframe comprises a second source pad having two external leads and an internal finger extending toward a second electrode of the integrated circuit.

6. The multi-chip leadless module of claim 1 wherein the integrated circuit has electrodes for Vdd, Vm, and TEST.

7. The multi-chip leadless module of claim 1 wherein the leadframe is half-etched.

8. The multi-chip leadless module of claim 1 further comprising a clip attached to the drains of the dual channel mosfet.

9. A method for manufacturing a multi-chip leadless module comprising:
providing an integrated circuit having a plurality of electrodes;
providing a dual channel mosfet having first and second source electrodes, first and second gate electrodes and a common drain electrode;

providing a leadframe with a plurality of leads, each lead with an exposed contact surface on an outer bottom surface of the module for carrying electrical power to the integrated circuit and to the dual channel mosfet or for carrying electrical signals to and from the integrated circuit and the dual channel mosfet;

assembling the integrated circuit and the dual channel mosfet on the leadframe by connecting a first electrode of the integrated circuit and to the gate of one dual channel mosfet, connecting a second lead to a second electrode of the integrated circuit and to the gate of the other dual channel mosfet, connecting a third lead to a third electrode of the integrated circuit and to the source of one of the dual channel mosfets, and connecting a fourth lead of the integrated circuit and to the source of the other dual channel mosfet; and encapsulating the leadframe and the devices in insulating resin wherein resin exposes contact surfaces of the leads on the outer bottom surface of the module.

10. The method for manufacturing a multi-chip leadless module of claim 9 further comprising connecting one or more other leads to corresponding one or more other electrodes of the integrated circuit.

11. The method for manufacturing a multi-chip leadless module of claim 9 wherein the integrated circuit and the dual channel mosfet have pillars or bumps to connect the integrated circuit and the dual channel mosfet to the leads.

12. The method for manufacturing a multi-chip leadless module of claim 9 further comprising the step of half etching one or more pads and flip chip mounting a mosfet on each half-etched pad.

13. The method for manufacturing a multi-chip leadless module of claim 9 wherein the leadframe comprises a second source pad having two external leads and an internal finger extending toward a second electrode of the integrated circuit.

14. The method for manufacturing a multi-chip leadless module of claim 9 further comprising the step of half-etching the leadframe before assembling the integrated circuit and the dual channel mosfet on the leadframe.

15. The method for manufacturing a multi-chip leadless module of claim 9 further comprising the step of attaching a clip to the drains of the dual channel mosfet.

16. A multi-chip leadless module comprising:

an integrated circuit having a plurality of electrodes;

a dual channel mosfet having first and second source electrodes, first and second gate electrodes and a common drain electrode;

a leadframe having a plurality of leads, each lead with an exposed contact surface on an outer bottom surface of the module for carrying electrical power to the integrated circuit and to the dual channel mosfet or for carrying electrical signals to and from the integrated circuit and the dual channel mosfet;

an encapsulating and insulating resin embedding the leadframe, the integrated circuit and the dual channel mosfet into a module and defining the exposed contact surfaces of the leads on the outer bottom surface of the module;

wherein a first lead is connected to a first electrode of the integrated circuit and to the gate of one dual channel mosfet, a second lead is connected to a second electrode of the integrated circuit and to the gate of the other dual channel mosfet, and a third lead is connected to a third electrode of the integrated circuit and to the source of one of the dual channel mosfets.

17. The multi-chip leadless module of claim 16 wherein one or more other leads are connected respectively to corresponding one or more other electrodes of the integrated circuit.

18. The multi-chip leadless module of claim 16 wherein the leadframe has one or more half-etched pads, each pad for receiving flip chip mounted mosfets.

19. The multi-chip leadless module of claim 16 wherein the integrated circuit comprises one or more raised surfaces for attaching to leads of the leadframe.

20. The multi-chip leadless module of claim 16 wherein the leadframe is half-etched.

21. The multi-chip leadless module of claim 16 further comprising a clip attached to the drains of the dual channel mosfet.

* * * * *